(12) United States Patent
Takebayashi et al.

(10) Patent No.: US 9,391,560 B2
(45) Date of Patent: Jul. 12, 2016

(54) SEMICONDUCTOR INTEGRATED CIRCUIT, OSCILLATOR, ELECTRONIC APPARATUS, AND MOVING OBJECT

(71) Applicant: Seiko Epson Corporation, Tokyo (JP)

(72) Inventors: Yuichi Takebayashi, Sagamihara (JP); Mikio Shigemori, Minowa (JP); Takuya Owaki, Minowa (JP); Kunihito Yamanaka, Minowa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/689,404

(22) Filed: Apr. 17, 2015

(65) Prior Publication Data

US 2015/0303872 A1    Oct. 22, 2015

(30) Foreign Application Priority Data

Apr. 18, 2014  (JP) ................. 2014-086425

(51) Int. Cl.
| | |
|---|---|
| *H03B 5/32* | (2006.01) |
| *H03B 19/00* | (2006.01) |
| *G06F 1/06* | (2006.01) |
| *G06F 1/08* | (2006.01) |
| *G06F 1/10* | (2006.01) |

(52) U.S. Cl.
CPC *H03B 5/326* (2013.01); *G06F 1/06* (2013.01); *G06F 1/08* (2013.01); *G06F 1/10* (2013.01); *H03B 19/00* (2013.01)

(58) Field of Classification Search
CPC ........... G06F 1/04; G06F 1/06; G06F 1/08; G06F 1/10; G06F 1/12; H03B 5/30; H03B 5/32; H03B 5/326; H03B 19/00; H03B 19/12
USPC ............. 327/269, 295, 297; 331/74, 107 A, 331/108 C, 116 FE, 116 M, 116 R, 154, 158, 331/185, 186
See application file for complete search history.

(56) References Cited

U.S. PATENT DOCUMENTS

| | | | | |
|---|---|---|---|---|
| 5,521,948 A | * | 5/1996 | Takeuchi | H03L 7/1974 331/11 |
| 7,295,077 B2 | * | 11/2007 | Thomsen | H03L 7/0898 327/105 |
| 7,436,105 B2 | | 10/2008 | Takebayashi | |
| 7,852,408 B2 | * | 12/2010 | Arbel | H03L 7/1974 327/156 |
| 7,928,807 B2 | * | 4/2011 | Mishra | H04B 1/0082 331/22 |
| 8,797,110 B2 | * | 8/2014 | Fan | H04W 52/029 331/158 |
| 8,941,444 B2 | * | 1/2015 | Asamura | H03B 5/364 331/108 C |
| 2003/0098730 A1 | * | 5/2003 | Miyazaki | G06F 1/04 327/158 |
| 2003/0131274 A1 | * | 7/2003 | Mizuyabu | G06F 1/10 713/324 |

(Continued)

FOREIGN PATENT DOCUMENTS

| | | |
|---|---|---|
| JP | 2003-324317 A | 11/2003 |
| JP | 2006-245994 A | 9/2006 |

*Primary Examiner* — Levi Gannon
(74) *Attorney, Agent, or Firm* — Harness, Dickey & Pierce, P.L.C.

(57) ABSTRACT

A semiconductor integrated circuit includes a semiconductor substrate on which an oscillation circuit that generates an oscillation signal by oscillating a resonation element, and a plurality of output circuits that outputs signals based on the oscillation signal, are integrated. A package contains the semiconductor integrated circuit and the resonation element. In the semiconductor integrated circuit, an operation of a first output circuit and an operation of a second output circuit, among a plurality of output circuits, are controlled independently from each other.

15 Claims, 8 Drawing Sheets

(56) References Cited

U.S. PATENT DOCUMENTS

| | | | |
|---|---|---|---|
| 2005/0184773 A1* | 8/2005 | Boyko | G06F 1/06 327/156 |
| 2007/0024386 A1* | 2/2007 | Yamamoto | H03B 5/36 331/158 |
| 2008/0315963 A1* | 12/2008 | Huang | H03K 5/1565 331/74 |
| 2010/0045395 A1* | 2/2010 | Fu | G06F 1/08 331/179 |
| 2015/0102862 A1* | 4/2015 | Ishimaru | H03B 19/00 331/60 |

* cited by examiner

SEMICONDUCTOR INTEGRATED CIRCUIT, OSCILLATOR, ELECTRONIC APPARATUS, AND MOVING OBJECT

BACKGROUND

1. Technical Field

The present invention relates to a semiconductor integrated circuit, an oscillator, an electronic apparatus, and a moving object.

2. Related Art

In recent years, an oscillator in which a surface acoustic wave (SAW) resonator using a SAW is mounted has been used for a high-speed network communication, a moving object communication field, or the like. The SAW resonator can take out a high frequency signal using the SAW by providing an IDT electrode (comb-shaped electrode) on a piezoelectric substrate such as quartz crystal. A speed of the surface acoustic wave is determined by a type of the piezoelectric substrate, and as the cycle of the comb-shaped electrode is finer, the SAW resonator obtains a signal with the higher oscillation frequency. For this reason, the SAW resonator can be miniaturized so as to be able to easily correspond to a high frequency.

For example, JP-A-2006-245994 proposes an oscillator (referred to as a piezoelectric device in JP-A-2006-245994) which can be further miniaturized and thinner than that of the related art, by disposing a SAW resonator (referred to as a surface acoustic wave element chip in JP-A-2006-245994) in a thick bottom portion and disposing electronic components in a thin bottom portion.

However, in the oscillator described in JP-A-2006-245994, in a case in which it is desired to input an output signal to a plurality of ICs, an output is required to be branched by a fan-out buffer, and there is a case in which skew occurs or a jitter characteristic is degraded due to long wires from the ICs to the fan-out buffer, or a jitter characteristic of the output signal is degraded in the fan-out buffer. In addition, by using the fan-out buffer, there is a case in which skew occurs due to a wire length in the fan-out buffer.

SUMMARY

An advantage of some aspects of the invention is to provide a semiconductor integrated circuit in which, even if an output signal is input to a plurality of circuits, degradation of a jitter characteristic can be reduced. Another advantage of some aspects of the invention is to provide an oscillator, an electronic apparatus, and a moving object which use the semiconductor integrated circuit and have high reliability.

The invention can be implemented as the following forms or application examples.

Application Example 1

A semiconductor integrated circuit according to this application example includes: an oscillation unit which generates an oscillation signal by oscillating a resonation element; a first output unit and a second output unit which output signals based on the oscillation signal; and a control unit that controls the first output unit and the second output unit.

The resonation element is, for example, a surface acoustic wave (SAW) resonator, an AT cut quartz crystal resonator, an SC cut quartz crystal resonator, a tuning fork type quartz crystal resonator, other piezoelectric resonators, a micro electromechanical system (MEMS) resonator, or the like.

The first output circuit and the second output circuit may respectively output one signal, and output signals different from each other. In addition, the output signals may respectively be differential signals, and be single-ended signals. In addition, a state in which the signals are output from each output unit or the signals are not output, or a state of the output signals of types of the signals output from each output unit or the like, are controlled by the control unit.

According to the semiconductor integrated circuit of this application example, by the oscillation unit included in a single semiconductor integrated circuit, the first output unit, and the second output unit, at least two signals with low jitter based on the oscillation signal can be output, and thus if the at least two signals are respectively supplied to at least two circuits, a fan-out buffer which is configured by a semiconductor integrated circuit different from the oscillation unit is not required to be provided. Thus, even if the output signal is input to a plurality of circuits, degradation of a jitter characteristic can be reduced.

Application Example 2

A semiconductor integrated circuit according to this application example includes: an oscillation circuit, and first and second output circuits on a semiconductor substrate, the oscillation circuit generating an oscillation signal by oscillating a resonation element, and the first and second output circuit outputting signals based on the oscillation signal; and a control unit that controls operations of the first output circuit and the second output circuit.

The resonation element is, for example, a surface acoustic wave (SAW) resonator, an AT cut quartz crystal resonator, an SC cut quartz crystal resonator, a tuning fork type quartz crystal resonator, other piezoelectric resonators, a micro electromechanical system (MEMS) resonator, or the like.

The first output circuit and the second output circuit may respectively output one signal, and output signals different from each other. In addition, the output signals may respectively be differential signals, and be single-ended signals. Signal output states of each output circuit, and signal types of the signals output from each output circuit are controlled by the control unit. In addition, a state in which the signals are output from each output circuit or the signals are not output, or an operation of the output circuit of setting of types of the signals output from each output circuit or the like, are controlled by the control unit.

According to the semiconductor integrated circuit of this application example, by the oscillation circuit included in the semiconductor integrated circuit, the first output circuit, and the second output circuit, at least two signals with low jitter based on the oscillation signal can be output, and thus if the at least two signals are respectively supplied to at least two circuits, a fan-out buffer is not required to be provided on the outside and to be divided. Thus, even if the output signal is input to a plurality of circuits, degradation of a jitter characteristic can be reduced.

In addition, in a case in which a circuit in the rear stage of the semiconductor integrated circuit according to this application example requires an output signal from, for example, the first output circuit, an operation in which the output signal from the second output circuit is stopped, or whether or not the signal is set to be in a high impedance state is controlled, and thereby flexible usage is possible.

Application Example 3

In the semiconductor integrated circuit according to the application example described above, the control unit may independently control the operations of the first output circuit and the second output circuit.

According to the semiconductor integrated circuit of this application example, an operation of the first output circuit and an operation of the second output circuit are independently controlled, and thus, for example, in a case in which only the output signal from the first output circuit is required, a flexible usage is possible, in which the output signal from the second output circuit is stopped or is set to be in a high impedance state.

Application Example 4

In the semiconductor integrated circuit according to the application example described above, the semiconductor integrated circuit may further include a first power supply terminal and a second power supply terminal, in which the first output circuit may receive a power supply voltage from the first power supply terminal, and the second output circuit may receive a power supply voltage from the second power supply terminal.

According to the semiconductor integrated circuit of this application example, since the power supply terminals of the first output circuit and the second output circuit are differently provided, it is possible to reduce noise of one signal being transferred to another signal through a power supply.

According to the semiconductor integrated circuit of this application example, in a case in which a circuit in the rear stage requires only the output signal from, for example, the first output circuit, it is also possible to stop supplying of a power supply voltage from the second power supply terminal. Thus, it is possible to reduce unnecessary power consumption.

Application Example 5

In the semiconductor integrated circuit according to the application example described above, the semiconductor integrated circuit may further include a first division circuit which generates a first division signal by dividing the oscillation signal, and a second division circuit which generates a second division signal by dividing the first division signal, in which the first division circuit may receive a power supply voltage from the first power supply terminal, and outputs a signal based on the first division signal to the first output circuit, and in which the second division circuit may receive a power supply voltage from the second power supply terminal, and outputs a signal based on the second division signal to the second output circuit.

According to the semiconductor integrated circuit of this application example, by setting of the first division circuit and the second division circuit, the frequency of the output signal from the first output circuit and the frequency of the output signal from the second output circuit can be set differently from each other. Thus, a plurality of circuits in the rear stage can receive a plurality of output signals with frequencies different from each other.

Furthermore, according to the semiconductor integrated circuit of this application example, it is not necessary to provide a division circuit on the outside of the semiconductor integrated circuit, and thus the circuit in the rear stage can receive an output signal with a good jitter characteristic.

The first division circuit and the second division circuit can output the input signals as they are. For this reason, the circuit in the rear stage of the semiconductor integrated circuit according to the application example can receive output signals with the same frequencies, if necessary.

Application Example 6

In the semiconductor integrated circuit according to the application example described above, the first division circuit may include a delay circuit which delays the first division signal by a time which is required for the second division circuit to divide the first division signal.

According to the semiconductor integrated circuit of this application example, by the delay circuit, the time in which the first output circuit receives a signal based on the first division signal can be identical to the time in which the second output circuit receives a signal based on the second division signal. Thus, according to the semiconductor integrated circuit of the application example, it is possible to generate a plurality of output signals with a little skew.

Application Example 7

An oscillator according to this application example includes: any of the semiconductor integrated circuits described above; the resonation element; and a package in which the semiconductor integrated circuit and the resonation element are contained.

According to the oscillator of this application example, by the first output circuit and the second output circuit which are included in the semiconductor integrated circuit, at least two signals with low jitter based on the oscillation signal can be output, and thus, if the at least two signals are respectively supplied to a plurality of circuits, it is not necessary to divide by providing the fan-out buffer on the outside. Thus, even if the output signal is input to a plurality of circuits, degradation of a jitter characteristic can be reduced.

Application Example 8

In the oscillator according to the application example described above, the resonation element may be a surface acoustic wave resonator.

The resonation element of the oscillator according to this application example is a surface acoustic wave resonator (hereinafter, referred to as SAW resonator). As the cycle of the comb-shaped electrode is finer, the SAW resonator obtains a signal with the higher oscillation frequency. For this reason, the oscillator according to the application example can generate a signal with a high oscillation frequency and can be miniaturized.

Application Example 9

In the oscillator according to the application example described above, the oscillator may further include a first output terminal through which a signal from the first output circuit is output, and a second output terminal through which a signal from the second output circuit is output, in which the first output terminal may be disposed along a first side of the package, and in which the second output terminal may be disposed along a second side opposite to the first side of the package.

According to the oscillator of this application example, it is possible to avoid interference between the output signal from the first output circuit and the output signal from the second output circuit, and to generate a plurality of output signals with a little skew and a good jitter characteristic.

Furthermore, since the interference is avoided, it may be laid out in such a manner that the first output circuit and the second output circuit are separated from each other on the semiconductor substrate.

Application Example 10

An electronic apparatus according to this application example includes any of the semiconductor integrated circuits or the oscillator described above.

Application Example 11

A moving object according to this application example includes any of the semiconductor integrated circuits or the oscillator described above.

According to these application examples, the semiconductor integrated circuit or a plurality of circuits in the rear stage of the oscillator receives a plurality of output signals with low jitter, and thus it is possible to realize an electronic apparatus and a moving object which have high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. The embodiments which will be described hereinafter are not intended to unduly limit the content of the invention described in the appended claims. In addition, all of the configurations which will be described hereinafter are not limited to essential configuration requirements of the invention.

1. Oscillator

Figure 1:
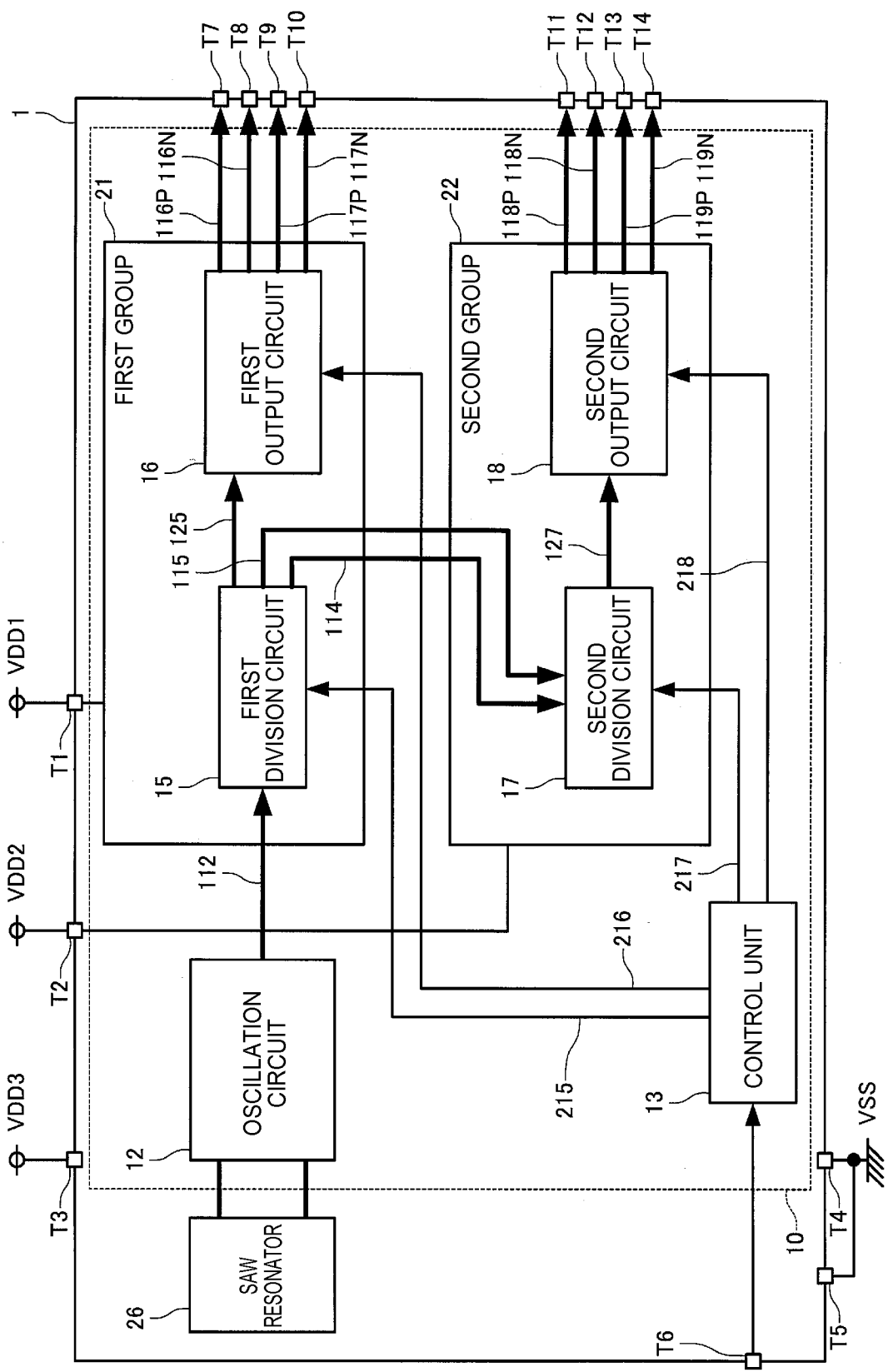
FIG. 1 is a block diagram of an oscillator according to the present embodiment.

FIG. 1 is a diagram showing a configuration of an oscillator 1 of the present embodiment. The oscillator 1 includes a SAW resonator 26 (an example of a resonation element), and a semiconductor integrated circuit 10. The SAW resonator 26 is connected to an oscillation circuit 12 included in the semiconductor integrated circuit 10.

The oscillator 1 includes fourteen terminals in total. Power supply voltages VDD1, VDD2, and VDD3 are respectively supplied to a terminal T1, a terminal T2, and a terminal T3. A ground voltage VSS is supplied to terminals T4 and T5. The power supply voltages VDD1 to VDD3 are all the same voltages. An output enable signal of the oscillator 1 is input to a terminal T6. When the output enable signal is at a high level, clock signals are output from a terminal T7 through a terminal T14.

The terminal T7 to the terminal T14 are used for outputting four clock signals which are differential signals. The terminal T7 and the terminal T8 respectively output a non-inverting signal 116P and an inverting signal 116N of a first clock signal. The terminal T9 and the terminal T10 respectively output a non-inverting signal 117P and an inverting signal 117N of a second clock signal. The terminal T11 and the terminal T12 respectively output a non-inverting signal 118P and an inverting signal 118N of a third clock signal. The terminal T13 and the terminal T14 respectively output a non-inverting signal 119P and an inverting signal 119N of a fourth clock signal.

The semiconductor integrated circuit 10 includes the oscillation circuit 12, a control unit 13, a first division circuit 15, a first output circuit 16, a second division circuit 17, and a second output circuit 18. The first division circuit 15 and the first output circuit 16 receive the power supply voltage VDD1 from the terminal T1 (an example of a first power supply terminal) so as to operate. The second division circuit 17 and the second output circuit 18 receive the power supply voltage VDD2 from the terminal T2 (an example of a second power supply terminal) so as to operate.

Here, a first group 21 and a second group 22 of a circuit of the semiconductor integrated circuit 10 are divided depending on a supply source of the power supply voltage. That is, the first division circuit 15 and the first output circuit 16 operate according to the power supply voltage VDD1, and the second division circuit 17 and the second output circuit 18 operate according to the power supply voltage VDD2.

The oscillation circuit 12 and the control unit 13 may operate by receiving the power supply voltage VDD3 from the terminal T3. In a case in which, for example, an output from the second output circuit 18 is not required, the oscillator 1 can suppress power consumption by stopping the supplying of the power supply voltage VDD2 and thereby stopping the whole second group 22. In addition, in a case in which, for example, an output from the first output circuit 16 is not required, the oscillator 1 can suppress power consumption by stopping the supplying of the power supply voltage VDD1 and thereby stopping all of the first group 21 and the second group 22. Even in this case, the oscillation circuit 12 and the control unit 13 can continue to operate.

The oscillation circuit 12 is connected to the SAW resonator 26 so as to form an oscillation loop. The oscillation circuit 12 generates an oscillation signal 112 by oscillating the SAW resonator 26. In the present embodiment, the oscillation circuit 12 is connected to the SAW resonator 26, but may be connected to an AT cut quartz crystal resonator, an SC cut quartz crystal resonator, a tuning fork type quartz crystal resonator, other voltage resonators, a micro electromechanical system (MEMS) resonator, or the like, instead of the SAW resonator 26. In addition, as a substrate material of the SAW resonator 26 or an oscillation element, a piezoelectric single quartz crystal such as Lithium Tantalite or Lithium Niobate in addition to a quartz crystal, a piezoelectric material such as piezoelectric ceramic such as Zirconate Titanate, a silicon semiconductor material, or the like may be used. An excitation unit of the SAW resonator 26 or a resonation element may use a piezoelectric effect, or may use electrostatic drive performed by the Coulomb force.

The control unit 13 receives the output enable signal of the oscillator 1 through the terminal T6. Then, the control unit 13 controls a clock signal output from the first output circuit 16 and the second output circuit 18, based on the output enable signal of the oscillator 1. The control unit 13 controls in such a manner that a first clock signal and a second clock signal are output from the first output circuit 16, or the output of the first output circuit 16 becomes a high impedance, according to a control signal 216 based on the output enable signal of the oscillator 1.

In addition, the control unit 13 controls in such a manner that a third clock signal and a fourth clock signal are output from the second output circuit 18, or the output of the second output circuit 18 becomes a high impedance, according to a control signal 218 based on the output enable signal of the oscillator 1.

Then, the control unit 13 generates a control signal 215 and a control signal 217, based on a voltage level of a bonding option pad of the semiconductor integrated circuit 10 which is not shown. Then, the control unit 13 designates a division ratio of the first division circuit 15 according to the control signal 215. In addition, the control unit 13 designates a division ratio of the second division circuit 17 according to the control signal 217. The control unit 13 may instruct stop or start of an operation also with regard to the oscillation circuit 12, according to a control signal which is not shown.

The control unit 13 may be a CPU. At this time, the CPU may include a storage unit in which a program of the control unit is stored, and may perform the control according to the output enable signal of the oscillator 1 and the program. In addition, each of the signals output from the first output circuit 16 and the second output circuit 18 may be a single ended signal other than a differential signal, and may be a signal corresponding to a CMOS, an LV-PECL, an LV-TTL, an LVDS, an HCSL, or the like. Furthermore, at least one of the first output circuit and the second output circuit may have a circuit configuration in which two or more signals of the various kinds of signals can be output, and a control in which a signal that is output from at least one of the first output circuit and the second output circuit is switched may be performed by a signal that is output from the control unit 13 based on a signal that is input through the terminal T6.

The first division circuit 15 generates a first division signal 114 by dividing the oscillation signal 112, and furthermore, generates a first division delay signal 115 which is obtained by delaying the first division signal 114. At this time, a division ratio is determined by the control signal 215. For example, the first division circuit 15 can select division ratios of 1, 1/2, 1/4, and 1/8. In a case in which the division ratio is 1, the oscillation signal 112 is output as the first division signal 114 as it is.

The first output circuit 16 includes two buffers which respectively convert a single-ended input into a differential output. Each buffer receives a signal 125, and differentially outputs as a first clock signal and a second clock signal. The first output circuit 16 outputs the first clock signal and the second clock signal, based on the control signal 216, but selects being in a high impedance state. In the present embodiment, two buffers are included in the first output circuit 16, but one buffer may be included, or three or more buffers may be included.

Here, as shown in FIG. 1, the first output circuit 16 receives the signal 125 which is obtained by further delaying the first division delay signal 115. The signal 125 is a signal based on the first division signal 114, and a relationship between the first division signal 114 and the first division delay signal 115 will be described later with reference to FIG. 3.

The second division circuit 17 receives the first division signal 114 and the first division delay signal 115, and outputs a signal 127. The signal 127 is a signal based on the second division signal 124, and a division ratio of the second division circuit 17 is determined by the control signal 217. For example, the second division circuit 17 can select division ratios of 1 or 1/2. In a case in which the division ratio is 1/2, the second division circuit 17 sets the second division signal 124 whose frequency is half that of the first division signal 114, as the signal 127. Then, in a case in which the division ratio is 1, the second division circuit 17 sets the first division delay signal 115 as the signal 127.

The second output circuit 18 includes two buffers which respectively convert a single ended input into a differential output. Each buffer receives the signal 127, and differentially outputs the signal as a third clock signal and a fourth clock signal. The second output circuit 18 selects whether it outputs the third clock signal and the fourth clock signal, based on the control signal 218 or it is in a high impedance state. In the present embodiment, two buffers are included in the second output circuit 18, but one buffer may be included, or three or more buffers may be included.

Figure 2:
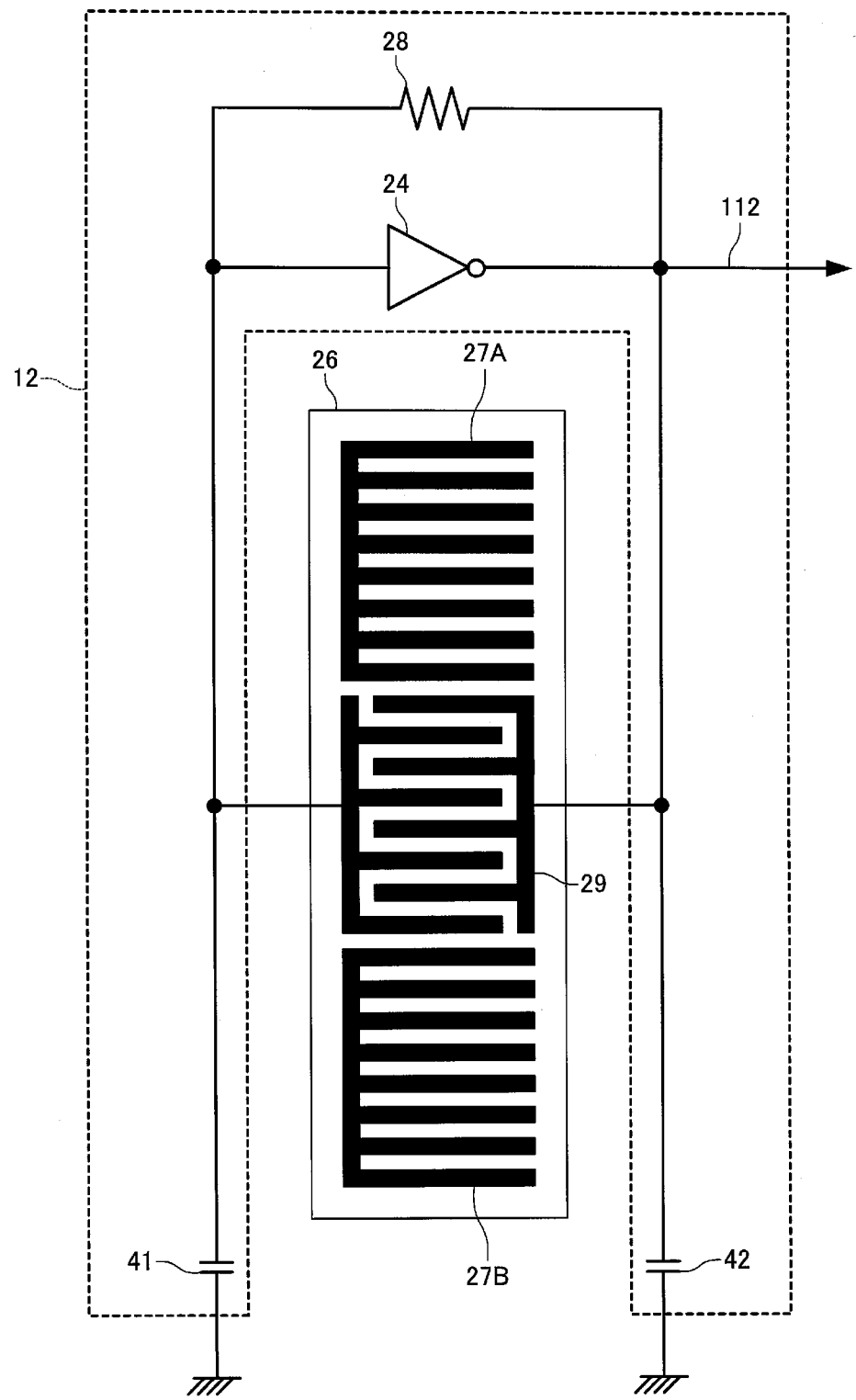
FIG. 2 is a diagram showing a configuration example of a SAW resonator and an oscillator circuit.

FIG. 2 is a diagram showing a detailed configuration of the SAW resonator 26 and the oscillation circuit 12. The same symbols or reference numerals are attached to the same signals as those in FIG. 1, and description thereof will be omitted. The SAW resonator 26 is configured by disposing a comb-shaped electrode 29 along a propagation direction of a surface acoustic wave on a piezoelectric substrate, and by disposing grating reflectors 27A and 27B on both sides of the electrode. A resonator (vibrator) is configured by making the center of the comb-shaped electrode 29 excite the surface acoustic wave, and by reflecting resonation energy of the surface acoustic wave which is excited by the grating reflectors 27A and 27b on both sides in a direction of the comb-shaped electrode 29. Since the frequency is determined by an electrode interval, the SAW resonator 26 can easily obtain a high frequency using a photolithography process, and the size can also be miniaturized.

Then, a feedback type oscillator circuit 12 is configured by connecting an inverter 24, a feedback resistor 28, and capacitors 41 and 42 to the comb-shaped electrode 29, as shown in FIG. 2. The inverter 24 which is connected to the feedback resistor 28 functions as an analog amplification circuit. Then, the oscillation signal 112 is generated by oscillating the SAW resonator 26.

Figure 3:
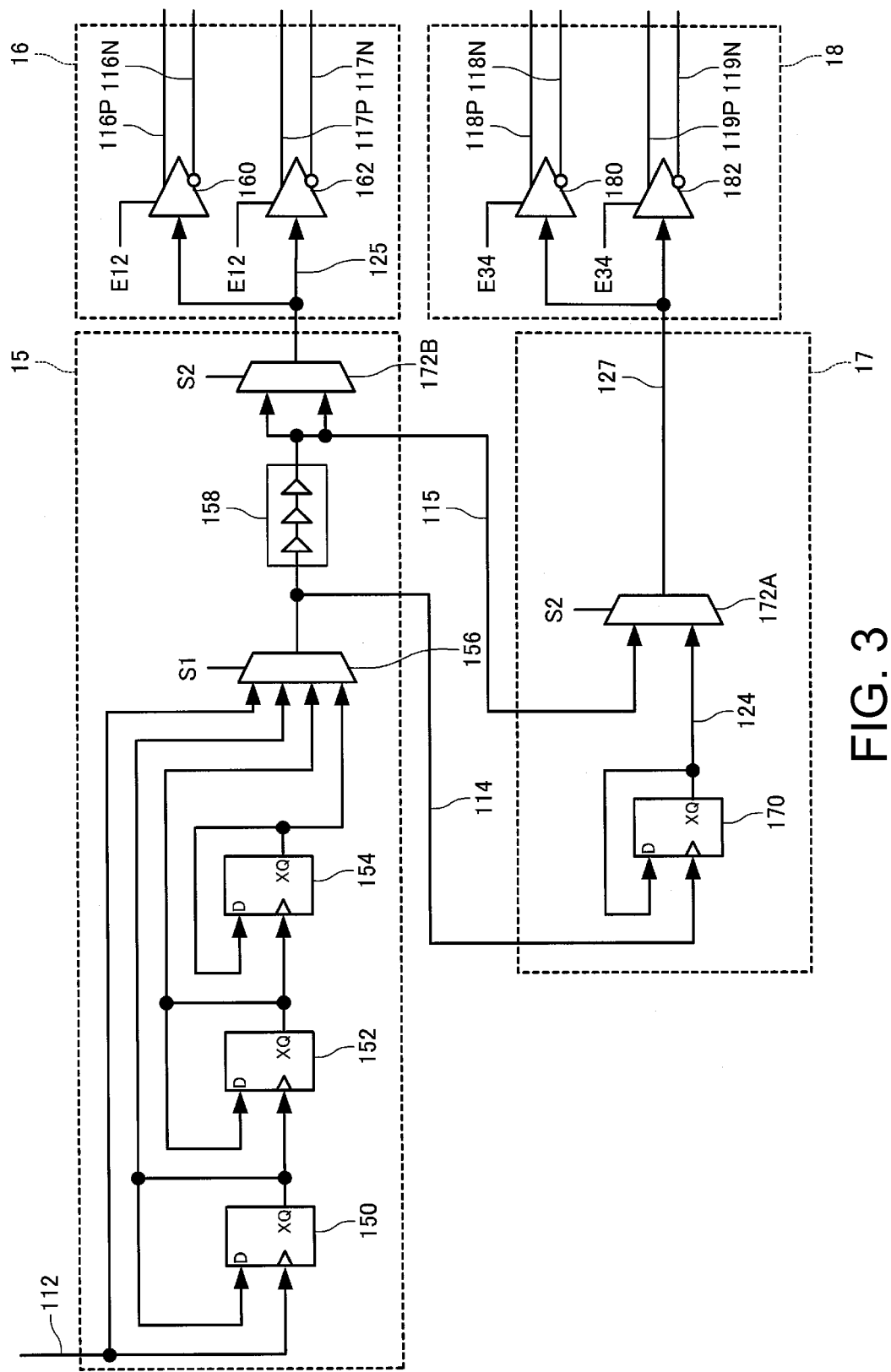
FIG. 3 is a diagram showing a configuration example of a dividing circuit and an output circuit.

FIG. 3 is a diagram showing a detailed configuration of the first division circuit 15, the first output circuit 16, the second division circuit 17, and the second output circuit 18. The same symbols and reference numerals are attached to the same signals as those of FIG. 1 and FIG. 2, and description thereof will be omitted.

The first division circuit 15 receives the oscillation signal 112. Flip-flops 150, 152, and 154 respectively generate a signal whose frequency is half that of the oscillation signal 112, a signal whose frequency is a quarter of that of the oscillation signal 112, and a signal whose frequency is one-eighth of that of the oscillation signal 112. Then, a selector 156 selects a signal according to a division ratio which is designated by the control unit 13 and set the selected signal as the first division signal 114. Here, the selector 156 can also select the oscillation signal 112, in a case in which the division ratio is 1. In addition, a selection signal 51 of the selector 156 corresponds to a portion of the control signals 215 from the control unit 13.

The first division circuit 15 generates the first division delay signal 115 by delaying the first division signal 114 using a delay circuit 158. Here, the delay time performed by the delay circuit 158 is designed so as to be the same as the time which is required for the second division circuit 17 to divide the first division signal 114.

In addition, the first division circuit 15 includes a selector 172B which has the same circuit configuration as that of the selector 172A which is included in the second division circuit 17. A selection signal S2 of the selector 172B is the same as the selection signal S2 of the selector 172A of the second division circuit 17. For this reason, timing at which the signal 125 from the first division circuit 15 is input to the first output circuit 16 can be identical to timing at which the signal 127 from the second division circuit 17 is input to the second output circuit 18. The selection signal S2 of the selector 172B corresponds to a portion of the control signals 215 from the control unit 13.

The first output circuit 16 includes two buffers 160 and 162. The buffers 160 and 162 receive the signal 125 which is a single ended signal and output differential signals. The buffer 160 outputs the non-inverting signal 116P and the inverting signal 116N of the first clock signal. The buffer 162 outputs the non-inverting signal 117P and the inverting signal 117N of the second clock signal.

The first output circuit 16 can make the two buffers 160 and 162 be in a high impedance state, according to a control signal E12. The control signal E12 corresponds to the control signal 216 from the control unit 13.

The second division circuit 17 receives the first division signal 114. A flip-flop 170 generates the second division signal 124 whose frequency is half that of the first division signal 114. Then, the selector 172A receives the first division delay signal 115 and the second division signal 124, selects a signal according to a division ratio which is designated by the control unit 13, and set the selected signal as the signal 127. That is, the selector 172A outputs the first division delay signal 115 in a case in which the division ratio is 1, and outputs the second division signal 124 in a case in which the division ratio is a half. The selection signal S2 of the selector 172A corresponds to the control signal 217 from the control unit 13.

Figure 4:
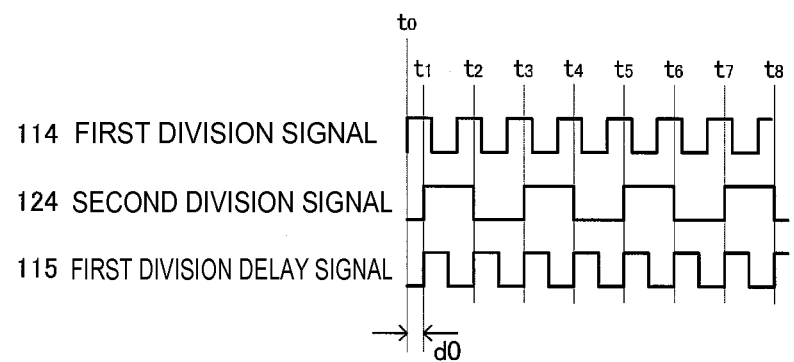
FIG. 4 is a diagram illustrating timing of signals of the oscillator according to the present embodiment.

Here, FIG. 4 is a diagram showing a relationship between the second division signal 124 in a case in which the division ratio in the second division circuit 17 is a half, the first division signal 114, and the first division delay signal 115. The second division circuit 17 receives the first division signal 114, and it takes time (that is d0) corresponding to a time point t0 to a time point t1, while the second division signal 124 is generated by dividing the first division signal 114. Here, the first division circuit 15 includes the delay circuit 158 which causes the delay d0. For this reason, it is possible to align the phases of the first division delay signal 115 and the second division signal 124 (time point t1 to time point t8). Thus, it is possible to output four clock signals in which the phases are aligned.

At time points t2, t4, t6, and t8 in FIG. 4, rising of the first division delay signal 115 corresponds to falling of the second division signal 124. For this reason, in a case in which a wire through which the first division delay signal 115 is transmitted and a wire through which the second division signal 124 is transmitted are disposed in parallel to each other so as to be adjacent, or the like, a jitter characteristic is easily degraded. In the oscillator 1 according to the present embodiment, the degradation of the jitter characteristic can be avoided by devising the layout, as will be described later with reference to FIG. 5.

The second output circuit 18 includes two buffers 180 and 182. The buffers 180 and 182 receive the signal 127 which is a single ended signal and output differential signals. The buffer 180 outputs the non-inverting signal 118P and the inverting signal 118N of the third clock signal. The buffer 182 outputs the non-inverting signal 119P and the inverting signal 119N of the fourth clock signal.

The second output circuit 18 can make the two buffers 180 and 182 be in a high impedance state, according to a control signal E34. The control signal E34 corresponds to the control signal 218 from the control unit 13.

In the present embodiment, the first output circuit 16 and the second output circuit 18 include the same number of buffers, but it is not necessary for the number of buffers to be the same. The first output circuit 16 and the second output circuit 18 can respectively include an arbitrary number of buffers.

Figure 9:
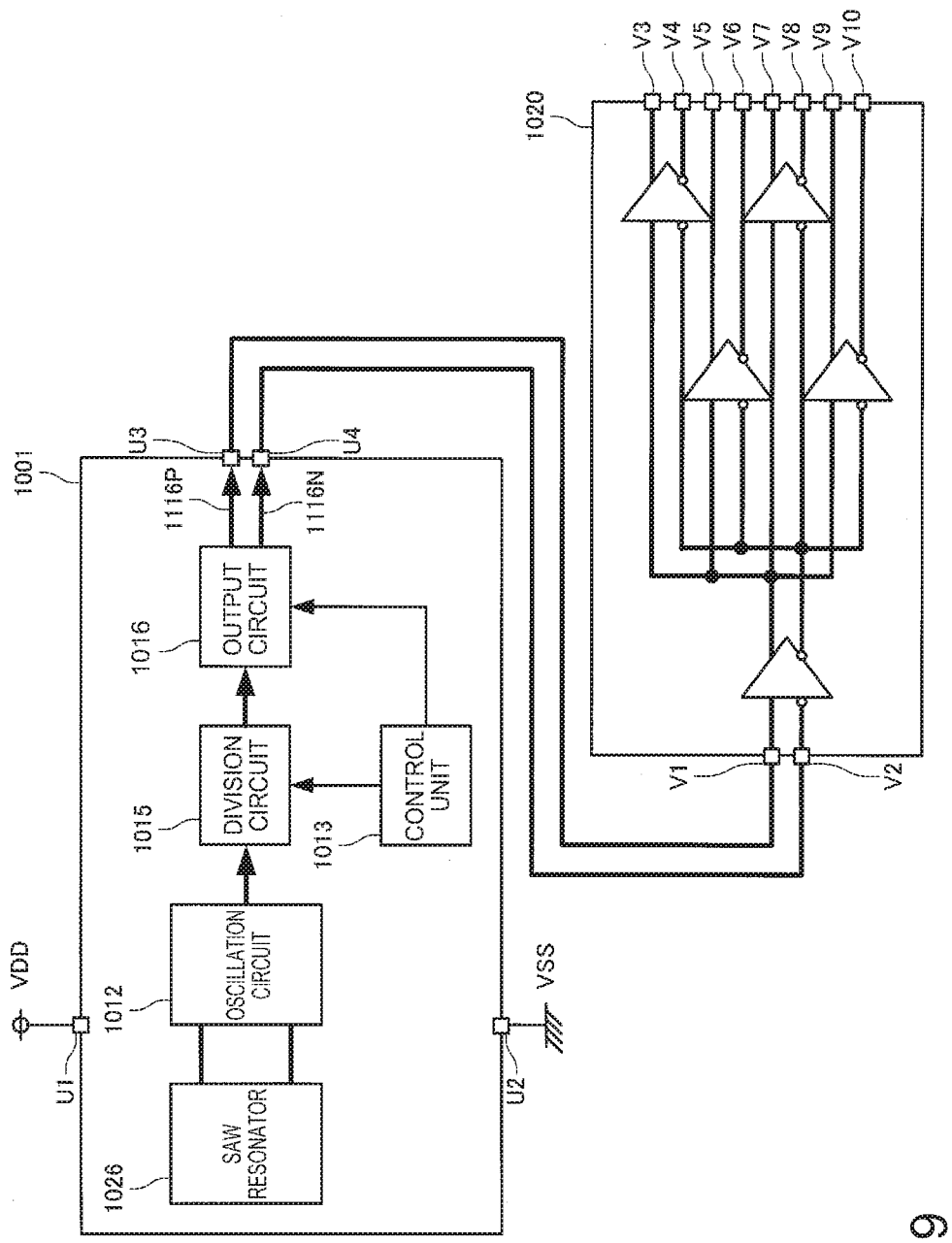
FIG. 9 is a diagram showing an example in which a plurality of output signals is generated in an oscillator of a comparative example.

Here, FIG. 9 is a diagram showing a case in which one clock signal from the oscillator 1001 according to a comparative example is divided by a fan-out buffer 1020 and thereby four clock signals are generated. Also in a case of FIG. 9, four clock signals can be finally generated in the same manner as in the oscillator 1 according to the present embodiment.

The oscillator 1001 according to the comparative example includes four terminals. The power supply voltage VDD is supplied to a terminal U1, and the ground voltage VSS is supplied to a terminal U2. A terminal U3 and a terminal U4 are used for outputting one clock signal which is a differential signal. The terminal U3 and the terminal U4 respectively output a non-inverting signal 1116P and an inverting signal 1116N of the clock signal.

The oscillator 1001 includes a SAW resonator 1026, an oscillation circuit 1012, a control unit 1013, a division circuit 1015, and an output circuit 1016. The SAW resonator 1026, the oscillation circuit 1012, and the control unit 1013 respectively correspond to the SAW resonator 26, the oscillation circuit 12, and the control unit 13 which are included in the oscillator 1 according to the present embodiment, and functions thereof are the same. Thus, description thereof will be omitted.

The division circuit 1015 corresponds to a circuit in which the delay circuit 158 and the selector 172B are omitted from the first division circuit 15 which is included in the oscillator 1 according to the present embodiment (refer to FIG. 3). At this time, the output circuit 1016 receives a signal corresponding to the first division signal 114 of the first division circuit 15 from the division circuit 1015.

The output circuit 1016 corresponds to a circuit in which the buffer 162 is omitted from the first output circuit 16 which is included in the oscillator 1 according to the present embodiment (refer to FIG. 3). At this time, only the non-inverting signal 1116P and the inverting signal 1116N of the clock signal are output from the oscillator 1001 according to the comparative example.

The fan-out buffer 1020 includes a total of 10 terminals. A terminal V1 and a terminal V2 are input terminals for respectively receiving the non-inverting signal 1116P and the inverting signal 1116N from the oscillator 1001. Then, a terminal V3 to a terminal V10 are used for outputting four clock signals which are differential signals. The terminal V3 to the terminal V10 respectively correspond to the terminal T7 to the terminal T14 (refer to FIG. 1) of the oscillator 1 according to the present embodiment, and detailed description thereof will be omitted.

As shown in FIG. 9, the fan-out buffer 1020 divides the received non-inverting signal 1116P and inverting signal 1116N respectively using the buffers, and generates four clock signals with the same waveform and frequency as the input clock signal. Thus, when the oscillator 1001 according to the comparative example and the fan-out buffer 1020 are combined, four clock signals can be also generated.

However, in the configuration of the comparative example, the fan-out buffer 1020 does not include a divider, and cannot output clock signals with different frequencies from each other, in the same manner as in the oscillator 1 according to the present embodiment. In addition, there is a possibility that external noise may be mixed into a wire which connects the terminal U3 and the terminal U4 of the oscillator 1001 to the terminal V1 and the terminal V2 of the fan-out buffer 1020, or a possibility that a jitter characteristic may be degraded by distortion of a waveform due to influence of inductance component or capacitance component of the wire. In addition, there is also a possibility that the four clock signals may have internal delays different from each other depending on the fan-out buffer 1020 to be selected.

However, the oscillator 1 according to the present embodiment includes the second division circuit 17 which generates the second division signal 124 by dividing the first division signal 114. For this reason, it is possible to set the frequency in such a manner that the frequencies of the clock signals from the buffer 160 and the buffer 162 are different from the frequencies of the clock signals from the buffer 180 and the buffer 182.

In addition, in the oscillator 1 according to the present embodiment, the first output circuit 16 and the second output circuit 18 which output the four clock signals are integrated in one semiconductor substrate. For this reason, there is a small possibility that external noise may be mixed into the wire between the terminals, or the jitter characteristic may be degraded due to the inductance component or the like, in the same manner as in the comparative example.

As described above, in the oscillator 1 according to the present embodiment, the timing at which the signal 125 from the first division circuit 15 is input to the first output circuit 16 can be identical to the timing at which the signal 127 from the second division circuit 17 is input to the second output circuit 18. For this reason, the degradation of the jitter characteristic due to division of the first division signal 114 hardly occurs.

Figure 5:
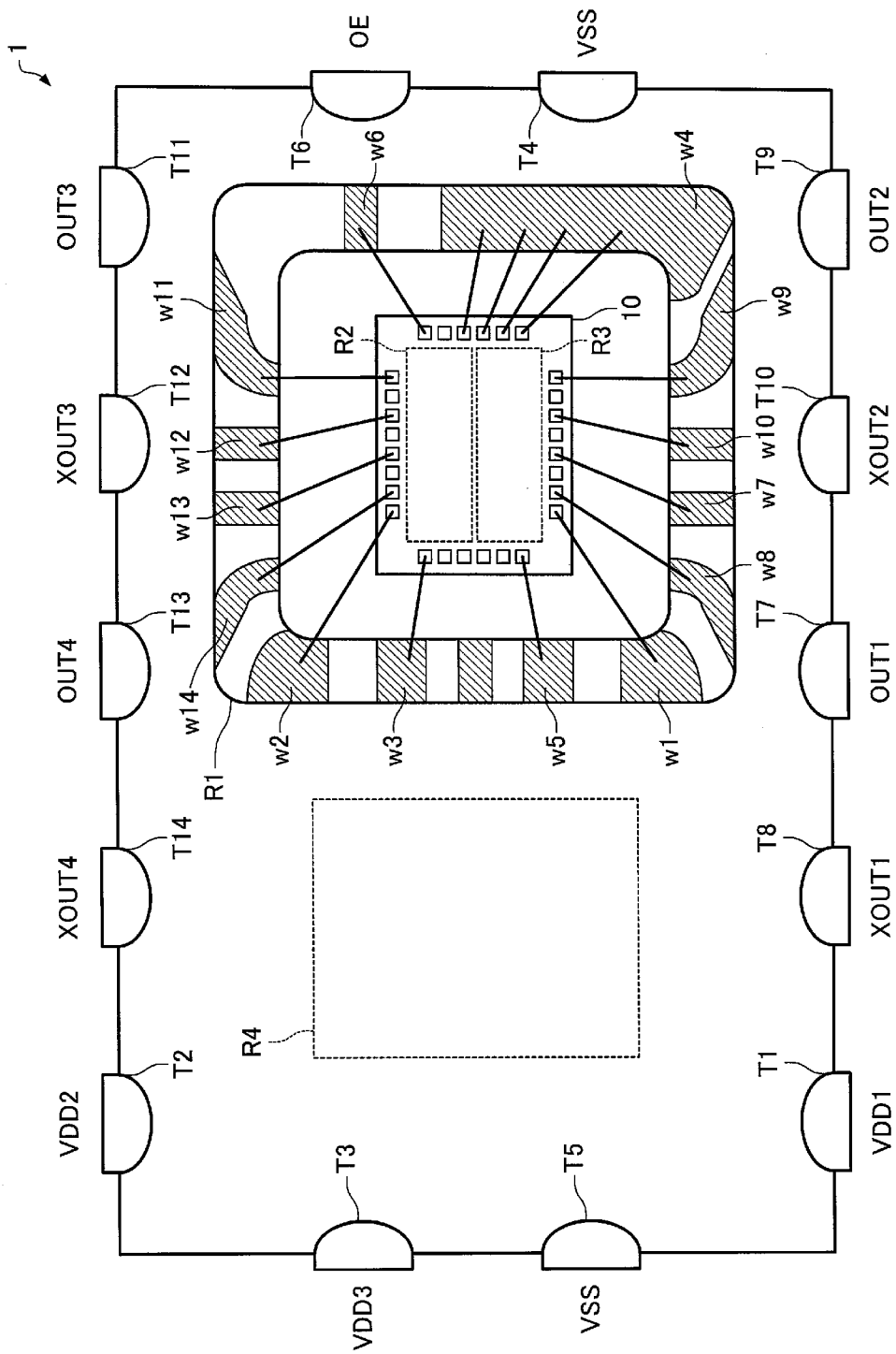
FIG. 5 is a diagram showing a disposition example of terminals of the oscillator according to the present embodiment.

FIG. 5 is a diagram showing a disposition example of the terminal T1 to the terminal T14 of the oscillator 1 according to the present embodiment. Here, the oscillator 1 in FIG. 5 is a diagram of a package which is viewed from the top, but transparency of a partial area R1 is shown in order to describe an inside of the semiconductor integrated circuit 10 inside the oscillator 1. The same symbols or reference numerals are attached to the same configurations as in FIG. 1 to FIG. 3, and description thereof will be omitted.

In FIG. 5, the terminal T1 to the terminal T14 of the oscillator 1 according to the present embodiment are disposed in sequence of the terminal T2 (terminal name: VDD2), the terminal T14 (terminal name: XOUT4), the terminal T13 (terminal name: OUT4), the terminal T12 (terminal name: XOUT3), the terminal T11 (terminal name: OUT3), the terminal T6 (terminal name: OE), the terminal T4 (terminal name: VSS), the terminal T9 (terminal name: OUT2), the terminal T10 (terminal name: XOUT2), the terminal T7 (terminal name: OUT1), the terminal T8 (terminal name: XOUT1), the terminal T1 (terminal name: VDD1), the terminal T5 (terminal name: VSS), and the terminal T3 (terminal name: VDD3) clockwise from the top left. Hereinafter, for convenience of description, there is a case in which the terminal is designated using the terminal name.

Then, as shown in the portion of the area R1, the oscillator 1 includes wires w1 to w14 which are electrically and respectively connected to the terminal T1 to the terminal T14. Multiple squares of solid lines which are arranged on the semiconductor integrated circuit 10 are contact pads, and are electrically connected to the wire w1 to the wire w14 by wire-bonding.

Here, in the oscillator 1 according to the present embodiment, OUT1, XOUT1, OUT2, and XOUT2 through which the first and second clock signals are output from the first output circuit 16 which is included in the first group 21 (refer to FIG. 1) are disposed on a lower side (an example of a first side) of the paper. In addition, VDD1 for supplying the first group 21 with power is also disposed on the lower side of the paper.

Meanwhile, OUT3, XOUT3, OUT4, and XOUT4 through which the third and fourth clock signals are output from the second output circuit 18 which is included in the second group 22 (refer to FIG. 1) are disposed in an upper side (an example of a second side) of the paper. In addition, VDD2 for supplying the second group 22 with power is also disposed in the upper side of the paper.

In the oscillator 1 according to the present embodiment, OUT1, XOUT1, OUT2, and XOUT2 (each one is an example of first output terminals), and OUT3, XOUT3, OUT4, and XOUT4 (each one is an example of second output terminals) are disposed in each of the facing sides. For this reason, the oscillator can generate a plurality of clock signals in which interference between the first and second clock signals and the third and fourth clock signals is reduced, variation is small, and a jitter characteristic is good.

At this time, since the first group 21 and the second group 22 use power supply terminals different from each other, noise wraparound from one out signal to another out signal through a common power supply is also reduced. For this reason, problems hardly occur in which noise from the third and fourth clock signals with a low frequency is induced into the first and second clock signals with a high frequency, and thereby the noise is observed as spurious of low frequency.

Furthermore, it is assumed that the semiconductor integrated circuit 10 is divided into an area R2 close to an upper side and an area R3 close to a lower side. At this time, a circuit which is configured by the first group 21 including the first division circuit 15 and the first output circuit 16 is disposed in the area R3. Meanwhile, a circuit which is configured by the second group 22 including the second division circuit 17 and the second output circuit 18 is disposed in the area R2. By disposing the circuits in this way, a signal belonging to the first group 21 and a signal belonging to the second group 22 which can have frequencies possibly different from each other can hardly interfere with each other, even if the circuits are integrated into one semiconductor substrate.

In the oscillator 1 according to the present embodiment, the SAW resonator 26 is disposed in the area R4 separated from the semiconductor integrated circuit 10, but the SAW resonator 26 may be disposed so as to overlap (three-dimensionally in a vertical direction, that is, in the front or the back of the paper), for example, the semiconductor integrated circuit 10 for miniaturization.

As described above, even if the plurality of buffers (buffers 160, 162, 180, and 182) and the oscillation circuit are integrated into one semiconductor substrate, the oscillator 1 according to the present embodiment can reduce the degradation of the output signals (first to fourth clock signals) from the buffers.

2. Electronic Apparatus

An electronic apparatus 300 according to the present embodiment will be described using FIG. 6 and FIG. 7. The same symbols or reference numerals will be attached to the same configurations as those of FIG. 1 to FIG. 5, and description thereof will be omitted.

Figure 6:
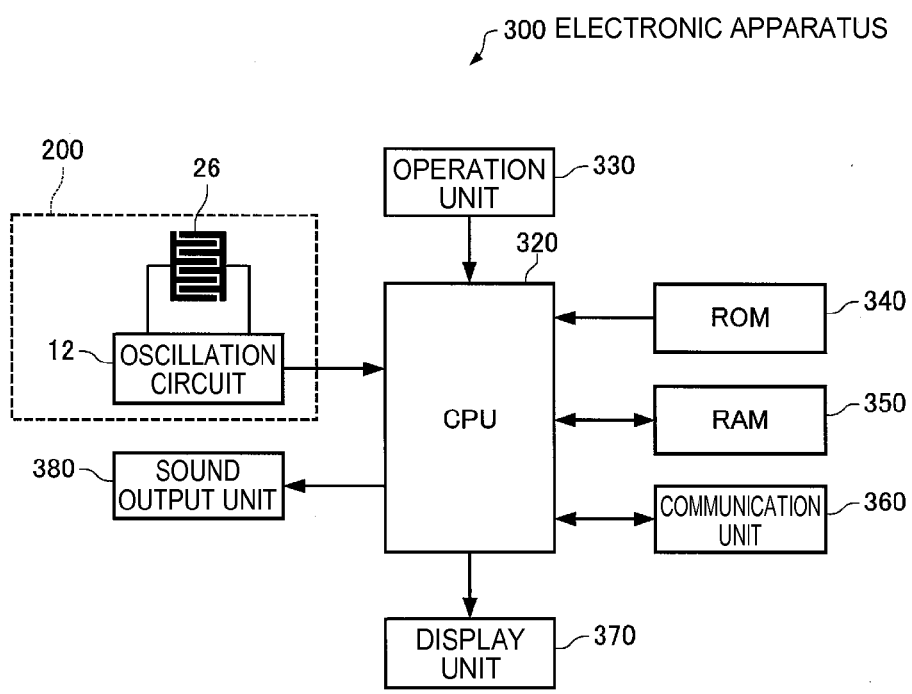
FIG. 6 is a functional block diagram of an electronic apparatus.

FIG. 6 is a functional block diagram of an electronic apparatus 300. The electronic apparatus 300 is configured to include an oscillator 200 which includes the oscillation circuit 12 and the SAW resonator 26, a central processing unit (CPU) 320, an operation unit 330, a read only memory (ROM) 340, a random access memory (RAM) 350, a communication unit 360, a display unit 370, and a sound output unit 380. The electronic apparatus 300 may be configured by omitting a portion of the configuration elements (each unit) in FIG. 6, or by modifying the configuration elements, and may be configured by adding other configuration elements.

The oscillation unit 200 supplies clock pulses not only to the CPU 320 but also to each unit (not shown). The oscillation unit 200 corresponds to the oscillator 1 in which the semiconductor integrated circuit 10 is connected to the SAW resonator 26. However, in FIG. 6, only the oscillation circuit 12 of the elements in the semiconductor integrated circuit 10 is shown.

The CPU 320 operates according to a program which is stored in the ROM 340 or the like, and performs various calculation processing or control processing using the clock pulses (correspond to a clock signal from the semiconductor integrated circuit 10) which are output from the oscillation unit 200. Specifically, the CPU 320 performs various processing according to an operation signal from the operation unit 330, processing of controlling the communication unit 360 in order to perform data communication with external device, processing of transmitting a display signal for displaying various information on the display unit 370, processing of outputting various sounds to the sound output unit 380, and the like.

The operation unit 330 is an input device which is configured by operation keys, button switches, or the like, and outputs an operation signal according to an operation performed by a user to the CPU 320.

The ROM 340 stores a program that is used for various calculation processing or control processing which is performed by the CPU 320, or data.

The RAM 350 is used as working area of the CPU 320, and temporarily stores a program which is read from the ROM 340 or data, data which is input from the operation unit 330, operation results or the like which are obtained as the CPU 320 operates according to various programs.

The communication unit 360 performs various controls for a data communication between the CPU 320 and an external device.

The display unit 370 is a display device which is configured by a liquid crystal display (LCD) and the like, and displays various information based on a display signal which is input from the CPU 320.

The sound output unit 380 is a device which outputs a sound of a speaker or the like.

As described above, the oscillation unit 200 (the oscillator 1) supplies a plurality of clocks with a good jitter characteristic. At this time, the oscillation unit 200 can also supply the CPU 320 with a high-speed clock, and supply the other functional blocks with a low-speed clock. At this time, since the fan-out buffer 1020 is not required, the electronic apparatus 300 can be miniaturized. In addition, since the jitter does not occur, it does not take time to perform a wiring layout, and it is possible to efficiently design the electronic apparatus 300.

Various devices can be used as the electronic apparatus 300. For example, a personal computer (for example, mobile type personal computer, laptop personal computer, tablet personal computer), a moving object terminal such as a mobile phone, a digital still camera, an inkjet ejection device (for example, inkjet printer), a storage area network apparatus such as a router or a switch, a local area network apparatus, a server apparatus which performs transmission and reception of various data on the network, an apparatus for a moving object terminal base station, a television, a video camera, a video recorder, a car navigation device, a pager, an electronic notebook (including communication function), an electronic dictionary, an electronic calculator, an electronic game apparatus, a controller for a game, a word processor, a workstation, a videophone, a security television monitor, an electronic binocular, a POS terminal, a medical apparatus (for example, an electronic thermometer, a sphygmomanometer, a blood glucose meter, an electrocardiogram measuring device, an ultrasonic diagnostic apparatus, an electronic endoscope), a fish finder, various measurement apparatuses, instruments (for example, instruments of vehicle, aircraft, and ship), a flight simulator, a head-mounted display, a motion trace, motion tracking, a motion controller, a pedestrian position orientation measurement (PDR), or the like can be used.

Figure 7:
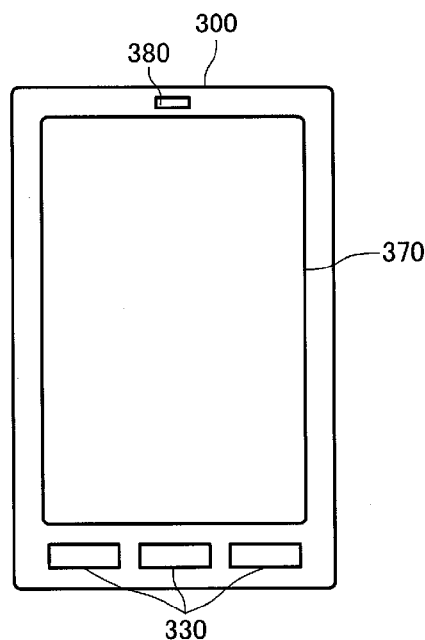
FIG. 7 is a diagram showing an example of an appearance of the electronic apparatus.

FIG. 7 is a diagram showing an example of the appearance of a smart phone which is an example of the electronic apparatus 300. The smart phone which is the electronic apparatus 300 includes buttons as the operation unit 330, and includes an LCD as the display unit 370. Then, since the smart phone which is the electronic apparatus 300 uses the oscillation unit 200 (the oscillator 1), the smart phone can be miniaturized, and can be efficiently designed.

3. Moving Object

A moving object 400 according to the present embodiment will be described using FIG. 8.

Figure 8:
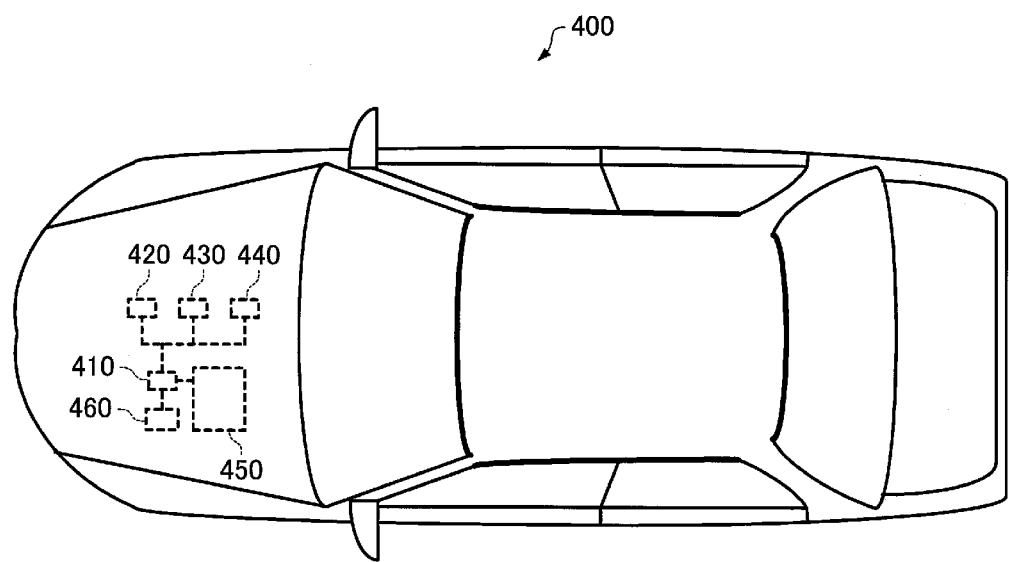
FIG. 8 is a diagram showing an example of a moving object.

FIG. 8 is a diagram (top view) showing an example of the moving object 400 according to the present embodiment. The moving object 400 shown in FIG. 8 is configured to include an oscillation unit 410, controllers 420, 430, and 440 which perform various controls of an engine system, a brake system, a keyless entry system, and the like, a battery 450, and a back-up battery 460. The moving object according to the present embodiment may be configured by omitting a portion of the configuration elements (each unit) in FIG. 8, or by modifying the configuration elements, and may be configured by adding other configuration elements.

The oscillation unit 410 corresponds to the oscillator 1. The detailed description of the other configuration elements will be omitted, but a high reliability is required to perform a control required for the travel of the moving object. For example, the reliability can be increased by including the back-up battery 460 in addition to the battery 450.

Also with regard to the oscillation unit 410, it is preferable that a back-up oscillation unit 410 is included to increase the reliability. That is, it is preferable that a plurality of clocks is included. At this time, by setting the oscillation unit 410 as the oscillator 1, it is possible to use a plurality of clocks with a good jitter characteristic and a high quality.

As the moving object 400, various devices can be used. For example, a vehicle (also includes an electric vehicle), an aircraft such as a jet plane and a helicopter, a ship, a rocket, a satellite, or the like can be used.

The invention is not limited to the present embodiment, and various modifications can be made within a range of the gist of the invention.

The embodiments and modification examples which are described above are just examples, and the invention is not limited to these. For example, it is possible to appropriately combine each embodiment and each modification example.

The invention includes substantially the same configuration (for example, a configuration in which a function, a method, and a result are the same, or a configuration in which an objective and an effect are the same) as the configuration described in the embodiments. In addition, the invention includes a configuration in which a non-essential portion of the configuration described in the embodiments is replaced. In addition, the invention includes a configuration in which the same action and effect as those of the configuration described in the embodiments can be obtained, or a configuration in which the same objective as that of the configuration described in the embodiments can be achieved. In addition, the invention includes a configuration in which a known art is added to the configuration described in the embodiments.

The entire disclosure of Japanese Patent Application No. 2014-086425, filed Apr. 18, 2014 is expressly incorporated by reference herein.

What is claimed is:

1. A semiconductor integrated circuit comprising:
   an oscillation unit which generates an oscillation signal by oscillating a resonation element;
   a first output unit and a second output unit which output signals based on the oscillation signal;
   a control unit that controls the first output unit and the second output unit;

a first division unit that generates a first division signal by dividing the oscillation signal from the oscillation unit;

a second division unit that generates a second division signal by dividing the first division signal from the first division unit;

a first power supply terminal; and a second power supply terminal, wherein:

the first output unit receives a power supply voltage from the first power supply terminal, the second output unit receives a power supply voltage from the second power supply terminal, the first division unit receives the power supply voltage from the first power supply terminal, and outputs a signal based on the first division signal to the first output unit, and the second division unit receives the power supply voltage from the second power supply terminal, and outputs a signal based on the second division signal to the second output unit.

2. An oscillator comprising:

semiconductor integrated circuit according to claim 1;

the resonation element; and a package in which the semiconductor integrated circuit and the resonation element are contained.

3. The oscillator according to claim 2, wherein the resonation element is a surface acoustic wave resonator.

4. The oscillator according to claim 2, further comprising:

a first output terminal through which a signal from the first output unit is output; and a second output terminal through which a signal from the second output unit is output, wherein the first output terminal is disposed along a first side of the package, and wherein the second output terminal is disposed along a second side opposite to the first side of the package.

5. An electronic apparatus comprising:

the semiconductor integrated circuit according to claim 1.

6. A moving object comprising:

semiconductor integrated circuit according to claim 1.

7. A semiconductor integrated circuit comprising:

an oscillation circuit, and first and second output circuits on a semiconductor substrate, the oscillation circuit generating an oscillation signal by oscillating a resonation element, and the first and second output circuits outputting signals based on the oscillation signal;

a control unit that controls operations of the first output circuit and the second output circuit;

a first division circuit that generates a first division signal by dividing the oscillation signal;

a second division circuit that generates a second division signal by dividing the first division signal;

a first power supply terminal; and a second power supply terminal, wherein:

the first output circuit receives a power supply voltage from the first power supply terminal, the second output circuit receives a power supply voltage from the second power supply terminal, the first division circuit receives the power supply voltage from the first power supply terminal, and outputs a signal based on the first division signal to the first output circuit, and the second division circuit receives the power supply voltage from the second power supply terminal, and outputs a signal based on the second division signal to the second output circuit.

8. The semiconductor integrated circuit according to claim 7, wherein the control unit independently controls the operations of the first output circuit and the second output circuit.

9. An oscillator comprising:

semiconductor integrated circuit according to claim 8;

the resonation element; and a package in which the semiconductor integrated circuit and the resonation element are contained.

10. An electronic apparatus comprising:

semiconductor integrated circuit according to claim 8.

11. A moving object comprising:

semiconductor integrated circuit according to claim 8.

12. The semiconductor integrated circuit according to claim 7, wherein the first division circuit includes a delay circuit which delays the first division signal by a time which is required for the second division circuit to divide the first division signal.

13. An oscillator comprising:

semiconductor integrated circuit according to claim 7;

the resonation element; and a package in which the semiconductor integrated circuit and the resonation element are contained.

14. An electronic apparatus comprising:

semiconductor integrated circuit according to claim 7.

15. A moving object comprising:

semiconductor integrated circuit according to claim 7.

* * * * *